(12) United States Patent
Ur et al.

(10) Patent No.: US 9,770,660 B2
(45) Date of Patent: Sep. 26, 2017

(54) STARTING SIMULATION FROM A REAL SITUATION

(75) Inventors: Shmuel Ur, Galil (IL); Ady Hascalovici, Sunnyvale, CA (US)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 0 days.

(21) Appl. No.: 13/703,338

(22) PCT Filed: Jun. 14, 2011

(86) PCT No.: PCT/US2011/040343
§ 371 (c)(1),
(2), (4) Date: Dec. 10, 2012

(87) PCT Pub. No.: WO2012/173602
PCT Pub. Date: Dec. 20, 2012

(65) Prior Publication Data
US 2013/0324239 A1    Dec. 5, 2013

(51) Int. Cl.
A63F 9/24        (2006.01)
A63F 13/00       (2014.01)
(Continued)

(52) U.S. Cl.
CPC .............. A63F 13/57 (2014.09); A63F 13/65 (2014.09); G06F 17/5009 (2013.01);
(Continued)

(58) Field of Classification Search
CPC ........ A63F 13/00; A63F 13/005; A63F 13/02; A63F 13/10
(Continued)

(56) References Cited

U.S. PATENT DOCUMENTS 5,462,275 A    10/1995  Lowe et al.
5,860,862 A    1/1999   Junkin
(Continued)

FOREIGN PATENT DOCUMENTS

JP    H08293810 A    11/1996
JP    2000308757 A   11/2000
(Continued)

OTHER PUBLICATIONS

Artificial Contender™ Overview, TruSoft: Artificial Contender™—behavior-capture AI Technology, http://trusoft.com/ac_overview.html [last accessed Oct. 25, 2012].
(Continued)

*Primary Examiner* — Milap Shah
*Assistant Examiner* — Jason Pinheiro
(74) *Attorney, Agent, or Firm* — Brundidge & Stanger, P.C.

(57) ABSTRACT

Technology is disclosed for starting a simulation from a real situation. In various embodiments, the technology receives a parameter corresponding to simulation of a physical entity in a virtual context, receives an attribute corresponding to the physical entity in a physical context, and simulates the physical entity in the virtual context using the attribute as a stimulus. The attribute may identify an actual occurrence during the physical context.

29 Claims, 11 Drawing Sheets

(51) Int. Cl.
  *G06F 17/00* (2006.01)
  *G06F 19/00* (2011.01)
  *A63F 13/57* (2014.01)
  *A63F 13/65* (2014.01)
  *G06F 17/50* (2006.01)
  *A63F 13/812* (2014.01)
(52) U.S. Cl.
  CPC ......... *A63F 13/812* (2014.09); *A63F 2300/65* (2013.01); *A63F 2300/69* (2013.01)
(58) Field of Classification Search
  USPC .......................................................... 463/42
  See application file for complete search history.

(56) References Cited

U.S. PATENT DOCUMENTS

| | | | |
|---|---|---|---|
| 5,890,963 | A | 4/1999 | Yen |
| 6,283,757 | B1 | 9/2001 | Meghnot et al. |
| 6,394,895 | B1 | 5/2002 | Mino |
| 6,612,925 | B1 * | 9/2003 | Forsberg .......................... 463/6 |
| 6,632,138 | B1 | 10/2003 | Serizawa et al. |
| 6,669,565 | B2 | 12/2003 | Liegey |
| 6,726,567 | B1 * | 4/2004 | Khosla ........................... 463/42 |
| 7,005,970 | B2 * | 2/2006 | Hodsdon .................. 340/323 R |
| 7,351,150 | B2 | 4/2008 | Sanchez |
| 7,657,920 | B2 | 2/2010 | Arseneau et al. |
| 7,728,920 | B2 | 6/2010 | Liang |
| 7,828,655 | B2 | 11/2010 | Uhlir et al. |
| 8,083,589 | B1 * | 12/2011 | Kavars et al. .................. 463/36 |
| 8,388,445 | B2 | 3/2013 | Pavlich et al. |
| 2001/0003715 | A1 * | 6/2001 | Jutzi et al. ....................... 463/40 |
| 2004/0067788 | A1 * | 4/2004 | Angelopoulos ................... 463/1 |
| 2004/0224740 | A1 * | 11/2004 | Ball et al. .......................... 463/6 |
| 2005/0202905 | A1 * | 9/2005 | Chesser ............. A63B 24/0021 473/415 |
| 2006/0258462 | A1 | 11/2006 | Cheng et al. |
| 2008/0242417 | A1 | 10/2008 | Schueller |
| 2008/0280685 | A1 * | 11/2008 | Hansen .................. A63F 13/12 463/42 |
| 2008/0312010 | A1 | 12/2008 | Marty et al. |
| 2009/0029754 | A1 | 1/2009 | Slocum et al. |
| 2009/0082879 | A1 | 3/2009 | Dooley et al. |
| 2009/0325686 | A1 | 12/2009 | Davis et al. |
| 2010/0026809 | A1 | 2/2010 | Curry |
| 2010/0029352 | A1 | 2/2010 | Angelopoulos |
| 2011/0039624 | A1 | 2/2011 | Potkonjak |

FOREIGN PATENT DOCUMENTS

| | | |
|---|---|---|
| JP | 2001347074 A | 12/2001 |
| JP | 2003175278 A | 6/2003 |
| JP | 2003241642 A | 8/2003 |
| JP | 2005218757 A | 8/2005 |
| JP | 2005316466 A | 11/2005 |
| JP | 2008173138 A | 7/2008 |
| JP | 2008241476 A | 10/2008 |
| JP | 2013501575 A | 1/2013 |
| KR | 1020040041297 A | 5/2004 |
| WO | 2011022108 A1 | 2/2011 |

OTHER PUBLICATIONS

Champandard, Alex J., "Behavior Capture and Learning Football by Imitation," http://aigamedev.com/open/reviews/learning-football-imitation/ [last accessed Oct. 25, 2012].

FIFA (video game series) on Wikipedia, the free encyclopedia, http://en.wikipedia.org/wiki/FIFA_%28video_game_series%29 [last accessed Oct. 25, 2012].

FIFA Soccer 13 Game Info, PS3, EA Sports Soccer, http://www.ea.com/soccer/fifa/ps3 [last accessed Oct. 25, 2012].

International Search Report and Written Opinion for Application No. PCT/US2011/040343 filed Jun. 14, 2011, mailing date Oct. 24, 2011, 11 pages.

Pavlacka, Adam, "The only choice in college ball," Jul. 26, 2003, NCAA Football Review 2004, xbox.GameSpy.com.

Plestina, Vladimir et all., "A modular system for tracking players in sports games," International Journal of Education and Information Technologies, Issue 4, vol. 3, 2009, pp. 197-204.

Seo, Yongduek et al., "Where Are the Ball and Players? Soccer Game Analysis with Color-Based Tracking and Image Mosaick," Lecture Notes in Computer Science, 1997, vol. 1311, Image Analysis and Processing, pp. 196-203.

Showcase: Artificial Contender™ in the development of SONY's This Is Football, TruSoft.com © 2007-2012 TruSoft International Inc.

"Broadcast Sports Incorporated", accessed at http://web.archive.org/web/20110227034526/http://www.broadcastsportsinc.com/, accessed on Sep. 26, 2014, 1 page.

"FIFA (video game series)," accessed at http://web.archive.org/web/20100615193908/http://en.wikipedia.org/wiki/FIFA_(video_game_series), last modified on Jun. 11, 2010, 10 pages.

"Fun Car Games," accessed at http://web.archive.org/web/20101222152829/http://www.auto-facts.org/fun-car-games.html, accessed on Sep. 26, 2014, 4 pages.

"Grab the wheel of your PC and racer," accessed at http://web.archive.org/web/20090419230402/http://www.race2play.com/front/second_front, accessed on Sep. 26, 2014, 2 pages.

"Gyroscope", accessed at http://web.archive.org/web/20110530175925/http://en.wikipedia.org/wiki/Gyroscope, modified on May 30, 2011, 7 pages.

"Hand Held Game Systems Reviews: Best Hand Held Game Systems," accessed at http://web.archive.org/web/20110105164816/http://www.consumersearch.com/hand-held-games, posted on Oct. 2010, 2 pages.

"Interesting Statistics of Online Game Market," accessed at http://web.archive.org/web/20100424054350/http://news.mmosite.com/content/2010-04-21/interesting_statistics_of_online_game_market.shtml, posted on Apr. 21, 2010, 4 pages.

"List of video game developers," accessed at http://web.archive.org/web/20100213083916/http://en.wikipedia.org/wiki/Lists_of_video_games, modified on Apr. 25, 2010, 12 pages.

"Massively multi player online game," accessed at http://web.archive.org/web/20110530222559/http://en.wikipedia.org/wiki/Massively_multiplayer_online_game, modified on May 29, 2011, 8 pages.

"NASCAR, The Game 2011," accessed at http://web.archive.org/web/20110529030942/http://nascarthegame.com/, accessed on Sep. 26, 2014, 2 pages.

"Showcase: Artificial Contender™ in the development of Sony's This Is Football," accessed at http://www.trusoft.com/showcase.html, accessed on Sep. 29, 2014, 1 page.

"Sim racing," accessed at http://web.archive.org/web/20100311011829/http://en.wikipedia.org/wiki/Sim_racing, modified on Mar. 8, 2010, pp. 4.

"The Premier Online Sim Racing Game," accessed at http://web.archive.org/web/20110531204035/http://www.iracing.com/, accessed on Sep. 26, 2014, 5 pages.

"Why is StarCraft Popular in Korea?," accessed at http://askakorean.blogspot.co.il/2010/02/why-is-starcraft-popular-in-korea.html, posted on Feb. 19, 2010, 25 pages.

Bell, C., "Video games: the sport of the future?," accessed at http://www.telegraph.co.uk/technology/video-games/10132883/Video-games-the-sport-of-the-future.html, posted on Jun. 26, 2013, 7 pages.

Cho, N., "I-Play Announces New Fast & Furious Mobile Game," accessed at http://www.mydigitallife.info/i-play-announces-new-fast-furious-mobile-game/, posted on (Mar. 24, 2009), 2 pages.

International Search Report and Written Opinion for PCT International Application No. PCT/US2011/041113 filed Jun. 20 2011, mailing date: Nov. 16, 2011, 8 pages.

Olausson, M., "Strategy Analytics: Online Game Revenue Fuels Global Video Game Software Market," accessed at http://www.reuters.com/article/2010/02/18/idUS214672+18-Feb-2010+BW20100218, posted on Feb. 18, 2010, 3 pages.

(56) References Cited

OTHER PUBLICATIONS

Scheve, T., "How NASCAR Broadcasts Work," accessed at http://web.archive.org/web/20101205024435/http://auto.howstuffworks.com/auto-racing/nascar/jobs/nascar-broadcast.htm, accessed on Sep. 26, 2014, 2 pages.
Tan, SY., "Race in Real-Time and Online Auto Racing Game," accessed at http://web.archive.org/web/20110503225911/http://www.mydigitallife.info/race-in-real-time-and-online-auto-racing-game/, posted on Aug. 27, 2008, 3 pages.
"Online video game market estimate," at—Google Search, (last accessed Oct. 25, 2012) 2 pages.
"Rockstar Games," accessed at http://www.rockstargames.com/, (last accessed Nov. 2, 2012), 2 pages.
"3ds," Google Search, pp. 1-2, (last accessed Nov. 2, 2012) 2 pages.
"Algorithm 3-axis mems wii," Google Search, pp. 1-2, (last accessed Nov. 2, 2012) 2 pages.
"Algorithm 3-axis mems," Google Search, pp. 1-2, (last accessed Nov. 2, 2012) 2 pages.
"Hand held game systems," Google Search, (last accessed Oct. 25, 2012) 2 pages.
"Live online racing," Google Search, (last accessed Oct. 25, 2012) 2 pages.
"Motion S face," Google Search, pp. 1-2, (last accessed Nov. 2, 2012) 2 pages.
"Online auto racing," Google Search, (last accessed Oct. 25 2012) 2 pages.
"DTM Racing Live Online," posted May 19 2008. 2 pages.
"Starcraft on TV," accessed at https://www.youtube.com/watch?v=embJbjOqt0g, May 15, 2006, pp. 2.

\* cited by examiner

STARTING SIMULATION FROM A REAL SITUATION

CROSS-REFERENCE TO RELATED APPLICATION

This Application is the U.S. National Stage filing under 35 U.S.C. §371 of International Application No. PCT/US2011/040343, filed on Jun. 14, 2011. The disclosure of the International Application is hereby incorporated herein by reference in its entirety.

BACKGROUND

People use simulators to simulate various real activities. As an example, people play video games that simulate real sports with real sports players. Video game players can use video game consoles to play various video games, e.g., sports video games. Some of these sports video games have even been endorsed by professional sports leagues, and can simulate real sports players and real sports teams that play real sports.

For many people, watching sports in real contexts (e.g., live or broadcast sports) is a very passionate activity. So much so, that people will set aside an entire afternoon, an entire day, or even several days to watch their favorite sports teams or sports players play individual and team sports. In the United States, the expression "Monday morning quarterbacking" is often used to describe behavior by sports fans who criticize or pass judgment over sports players, managers, and others with the benefit of hindsight. Sports fans in other countries can be equally passionate about what their favorite sports player or sports team could have done better to secure a better score or a win.

SUMMARY

Technology is disclosed for starting simulations from real situations ("the technology"). In various embodiments, the technology enables users to observe an activity in a physical context, begin simulation of that activity in a virtual context, and optionally participate in the simulation in place of one or more entities who are participating in the physical context. A real situation can be any physical context in which a physical entity can participate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
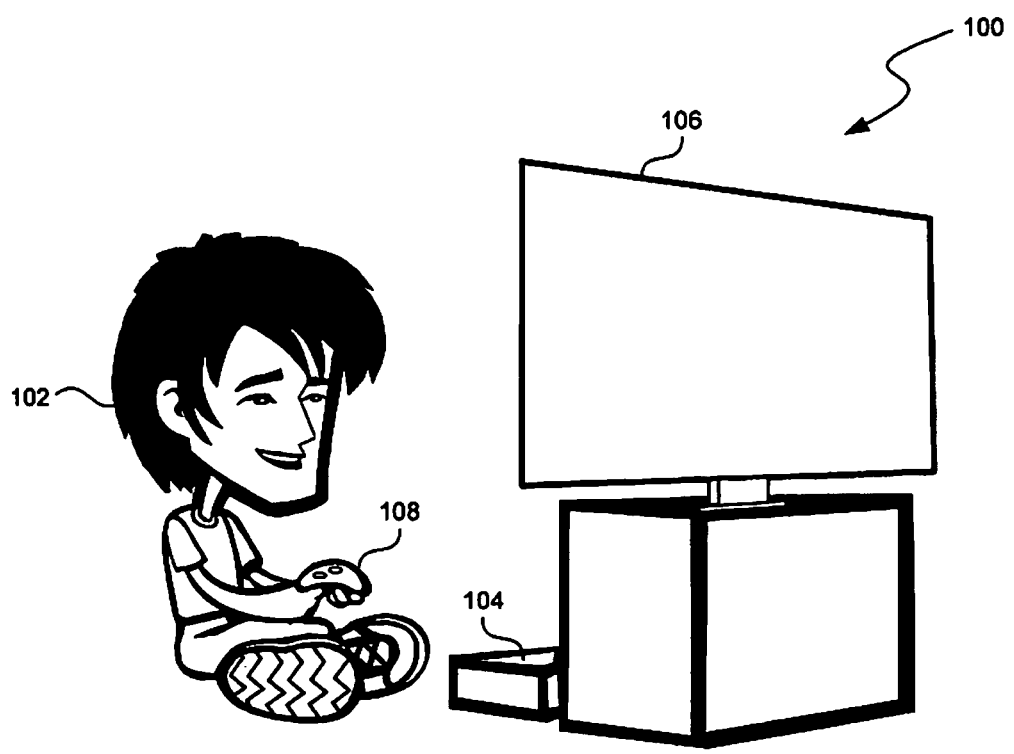
FIG. 1 is an environmental diagram illustrating an environment in which the technology may operate in some embodiments.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Technology is disclosed for starting simulations from real situations ("the technology"). In various embodiments, the technology enables users to observe an activity in a physical context, begin simulation of that activity in a virtual context, and optionally participate in the simulation in place of one or more entities who are participating in the physical context. As an example, the technology enables a user viewing a sports event (a real situation or physical context) on television to start a video game (a virtual context) in which the teams and players are in the same (or equivalent) positions in the video game as they were when the user started the game (a simulation). The user can then take control of one or more players in the video game, and the video game can control the other players. After playing the video game, the user can return to viewing the sports event. A real situation can be any physical context in which a physical entity can participate. Examples of physical contexts include sporting events, military battlefields, games, etc. Examples of physical entities include humans, animals, and machines. Various other physical contexts and physical entities can exist, and the technology can operate with any such physical context that is capable of being simulated.

In various embodiments, the technology receives and stores parameters and attributes relating to the physical context and physical entities. Parameters can include information about predicted movements, predicted behavior when presented a particular stimulus, etc. As an example, a sports player may prefer one side of a sports field or, when presented with a particular defensive formation, may respond predictably. These parameters may be included with a video game (e.g., on an optical disk or other medium used for distribution of the video game) and may be dynamically updated, e.g., using the Internet or other online network. Dynamic updating refers to the capability of software to receive and integrate updates after initial distribution or installation. Attributes can include information about a current physical context. Types of attributes can include recent injuries, game statistics, player statistics, score, positions of players, apparel/uniform changes, etc. By combining parameters to predict behavior of entities and attributes of a physical context, the technology can accurately simulate the physical context in a virtual context. As an example, a parameter may specify that when a "distance run" attribute of a particular sports player exceeds a specified number of meters, the sports player's accuracy and/or speed decreases. If during a game an attribute is observed indicating that the sports player has run more than the specified number of meters (whether actually before simulation began or in sum with the simulation), the technology may reduce the accuracy of the player's shots on goal. The technology can thus interoperate with various video games or other simulation tools to start simulations from real situations.

In various embodiments, a user (e.g., a video game player) can control sports players, coaches, or other physical entities during the simulation.

In various embodiments, the simulation may include control by multiple users who each control the same or different physical entities. As an example, in a multi-user game, a first user may control one or more sports players belonging to a first team and a second user may control one or more sports players belonging to a different team.

In various embodiments, simulations can include both real and virtual entities and game apparatuses. As an example, a game can include a virtual game apparatus (e.g., a virtual ball). A video game player may employ an augmented reality system (e.g., augmented reality glasses) to participate in the game. In such a case, the video game player may see the virtual ball and participate in the game by "kicking" the virtual ball. The video game player may also see virtual entities (e.g., a simulated sports player). Thus, the technology can enable users to participate in simulations that employ augmented reality techniques.

Turning now to the figures, FIG. 1 is an environmental diagram illustrating an environment 100 in which the technology may operate in some embodiments. The environment 100 can include a console or set-top box 104 (e.g., a video game console), display device 106 (e.g., a projector, monitor, television, etc.) and a controller 108 (e.g., a video game controller). A user 102 may operate the video game controller 108 to interact with a simulation, e.g., a video game, that is simulated by the console 104. The user 102 can provide input to the simulation via the controller 108, a microphone (not illustrated), or by using other input devices. Output from the simulation can be visually indicated in the display device 106, provided via a tactile response on the controller 108, and/or provided aurally using speakers (not shown). In various embodiments, various types of input and output can be employed. As an example, the user 102 may occupy a specially designed seat or other enclosure (not illustrated) that provides various types of simulated feedback.

Figure 2:
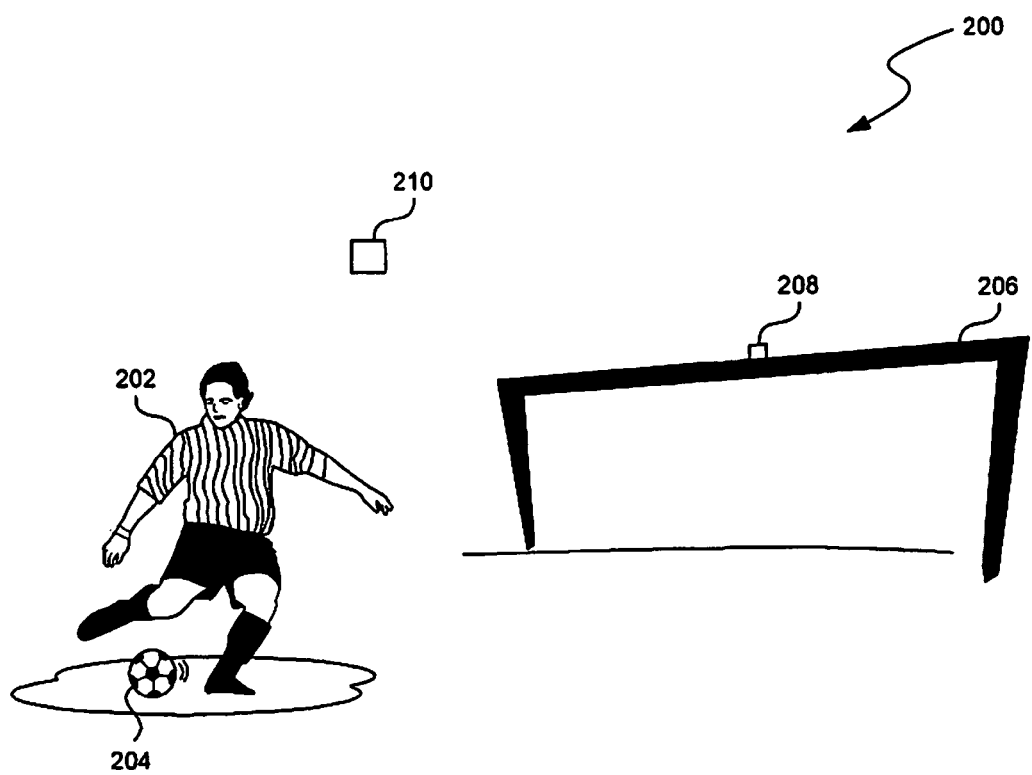
FIG. 2 is an environmental diagram illustrating an environment in which the technology may operate in some embodiments.

FIG. 2 is an environmental diagram illustrating an environment 200 in which the technology may operate in some embodiments. The environment 200 in a real context can include various components, a game apparatus 204 (e.g., a ball), and other appurtenances 206 of the real context (e.g., a goalpost). The technology may employ various components to actively observe the real context. As an example, a sensor 208 may detect positions sports players 202, positions of game apparatuses (e.g., balls), etc. Various sensors can be positioned along a sports field, embedded in or under a sports field, positioned atop a sports field, etc. A computing device 210 may receive information from observation devices, e.g., the sensor 208, or other sensors and/or cameras. Information received from the computing device 210 may be transmitted, e.g., for use in creating parameters or attributes for use in simulation.

Figure 3:
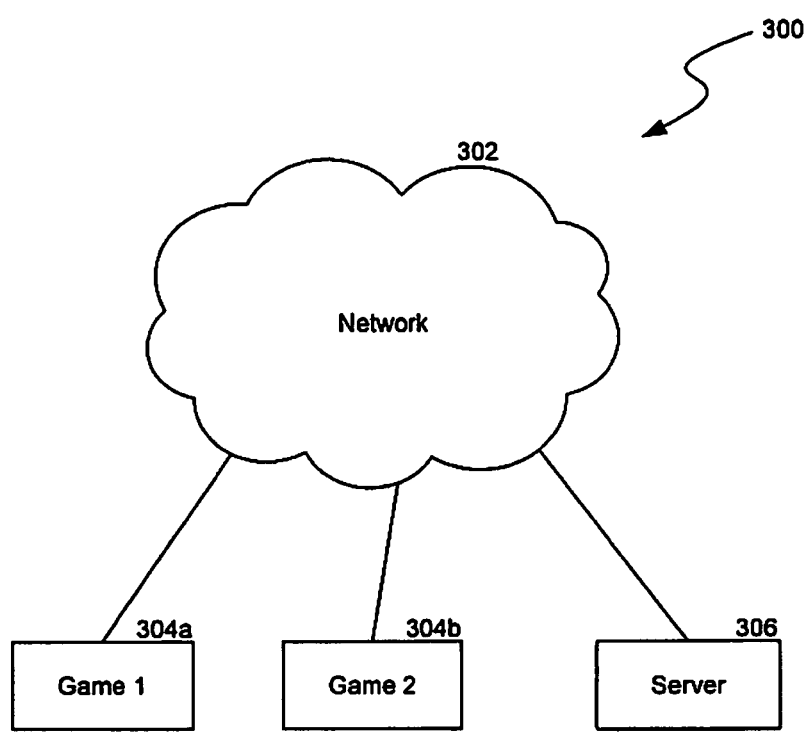
FIG. 3 is a block diagram illustrating components employed by the technology in various embodiments.

FIG. 3 is a block diagram illustrating components 300 employed by the technology in various embodiments. The components 300 can include a network 302, e.g., the Internet or an intranet, that enables one or more computing devices, e.g., a first game console 304a, a second game console 304b, and a server 306, to exchange communications with one another. As an example, the game consoles 304a and 304b may receive communications from the server 306 to indicate parameters, attributes, etc.

Figure 4:
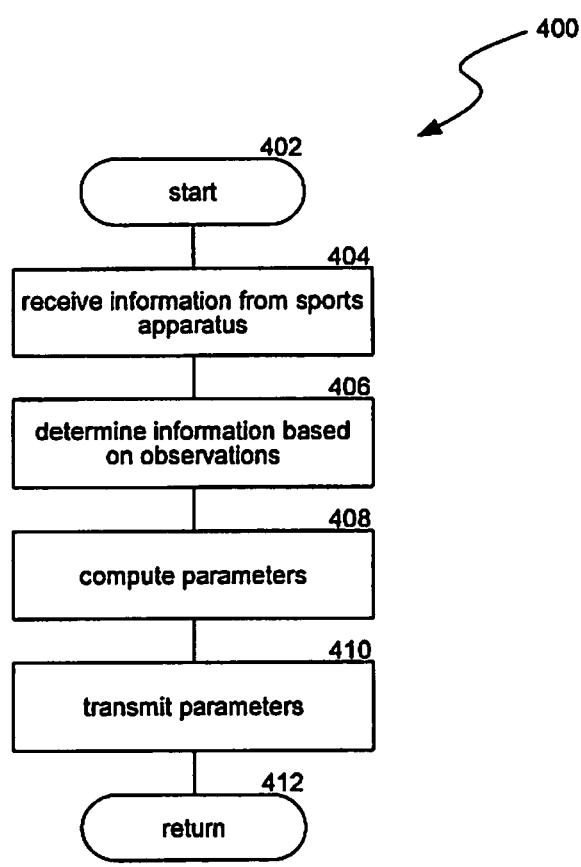
FIG. 4 is a flow diagram illustrating a routine that the technology may invoke in various embodiments, e.g., to collect and disseminate parameters.

FIG. 4 is a flow diagram illustrating a routine 400 that the technology may invoke in various embodiments, e.g., to collect and disseminate parameters. The routine 400 begins at block 402. The routine 400 then continues at block 404, where it receives information from one or more sports apparatuses. As an example, the routine 400 can receive information (e.g., via a computing device 210 described above in relation to FIG. 2) indicating a position of a ball. The routine 400 then continues at block 406, where it determines information based on observations. As an example, the routine 400 can determine information based on communications from sensors, image recognition based on images received from cameras or video cameras, etc. The routine 400 then continues at block 408, where it computes parameters. As an example, based on observations of sports players, sports fields, games, or other activities, the routine 400 may generate predictions that can be used during simulation. The predictions may be based on various stimuli. As an example, the routine 400 may determine that a particular sports player playing at a particular sports field is apt to perform in a particular way when faced with a particular stimulus. The routine 400 then continues at block 410, where it transmits the computer parameters. As an example, the routine 400 may transmit the parameters for use in video games. The routine 400 then continues at block 412, where it returns.

Those skilled in the art will appreciate that the logic illustrated in FIG. 4 and described above, and in each of the flow diagrams discussed below, may be altered in a variety of ways. For example, the order of the logic may be rearranged, sublogic may be performed in parallel, illustrated logic may be omitted, other logic may be included, etc.

Figure 5:
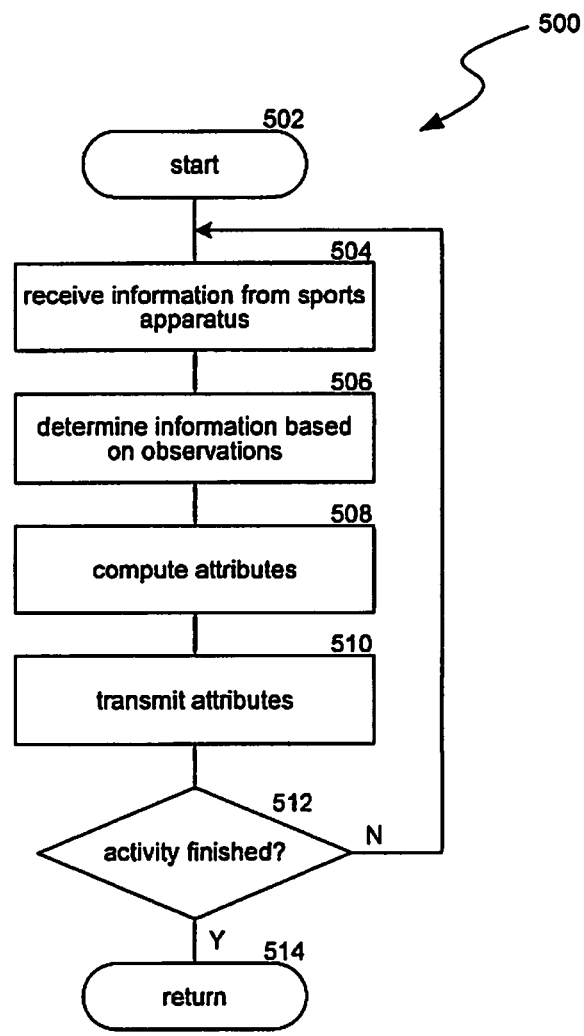
FIG. 5 is a flow diagram illustrating a routine that the technology may invoke in various embodiments, e.g., to collect and disseminate attributes.

FIG. 5 is a flow diagram illustrating a routine 500 that the technology may invoke in various embodiments, e.g., to collect and disseminate attributes. The routine 500 begins at block 502. The routine 500 then continues at block 504, where it receives information from one or more sports apparatuses. As an example, the routine 500 can receive information (e.g., via a computing device 210 described above in relation to FIG. 2) indicating a position of a ball. The routine 500 then continues at block 506, where it determines information based on observations. As an example, the routine 500 can determine information based on communications from sensors, image recognition based on images received from cameras or video cameras, etc. The routine 500 then continues at block 508, where it computes attributes. As an example, based on observations of sports players, sports fields, games, or other activities, the routine 500 may generate attributes that can be used during simulation. The attributes may indicate statistics of a presently occurring physical context. The routine 500 then continues at block 510, where it transmits the attributes, e.g., to game consoles. The routine 500 then continues at decision block 512, where it determines whether the activity, e.g., the physical context, has finished. As an example, the routine 500 may receive a signal that the sports event has finished. If the activity has finished, the routine returns at block 514. Otherwise, the routine continues at block 504.

Figure 6:
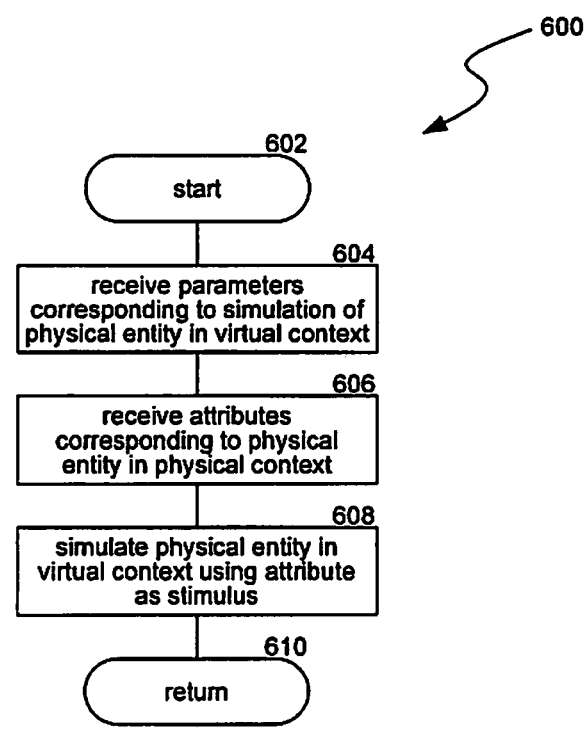
FIG. 6 is a flow diagram illustrating a routine that the technology may invoke in various embodiments, e.g., to receive and incorporate parameters.

FIG. 6 is a flow diagram illustrating a routine 600 that the technology may invoke in various embodiments, e.g., to receive and incorporate parameters. The routine 600 begins at block 602. The routine 600 then continues at block 604, where it receives parameters corresponding to simulation of one or more physical entities in virtual contexts. As an example, the routine 600 may receive parameters as part of a simulation, e.g., a video game that is being installed. Alternatively, the routine 600 may receive the parameters to dynamically update a previously installed simulation. The routine 600 then continues at block 606, where it receives attributes corresponding to one or more physical entities in the physical context. As an example, the routine 600 may receive attributes embedded in the signal that is broadcast during a sports event. The attributes may be broadcast via the Internet, a television signal, or other broadcast media. The routine 600 then continues at block 608, which simulates one or more physical entities in the virtual context, e.g., using the received attributes as stimuli. As an example, the routine 600 may cause a video game to simulate the present positions of sports players on a sports field. Once simulation begins, simulated sports players may position themselves according to their positions in the real physical context or according to behavior predicted by the parameters by using the user's inputs as stimuli. The simulation may continue until the user stops the simulation. The routine 600 then continues at block 610, where it returns.

Figure 7:
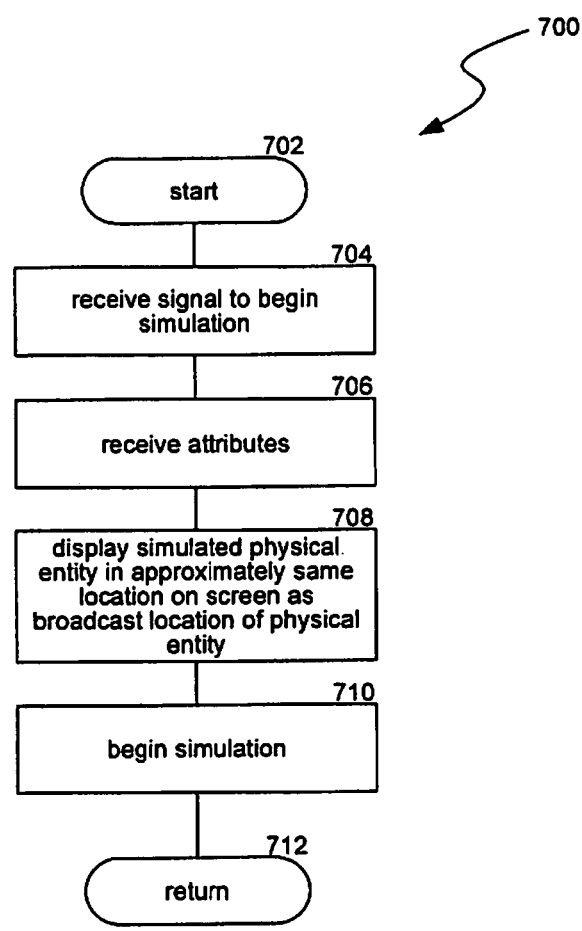
FIG. 7 is a flow diagram illustrating a routine that the technology may invoke in various embodiments, e.g., to receive and incorporate attributes.

FIG. 7 is a flow diagram illustrating a routine 700 that the technology may invoke in various embodiments, e.g., to receive and incorporate attributes. The routine 700 begins at block 702. The routine 700 then continues at block 704, where it receives a signal to begin simulation. As an example, the user may indicate to a game console to begin simulation. In various embodiments, the routine 700 then continues at block 706, where the game console may receive and store attributes during broadcast of the real context or may request the attributes when it begins the simulation. The routine 700 then continues at block 708, where it displays a simulated entity in approximately the same location on the screen (or other display) as the location of the corresponding physical entity in the physical context. In various embodiments, the routine 700 may receive an indication of the physical entity's location, e.g., as part of a broadcast signal or as a response to a request from a server computing device. In various embodiments, the routine 700 may determine an approximate location of the physical entity, e.g., using image recognition techniques applied to a television broadcast of the physical context. The routine 700 then continues at block 712, where it returns. The user may then continue to interact with the simulation, e.g., using a game console.

Figure 8:
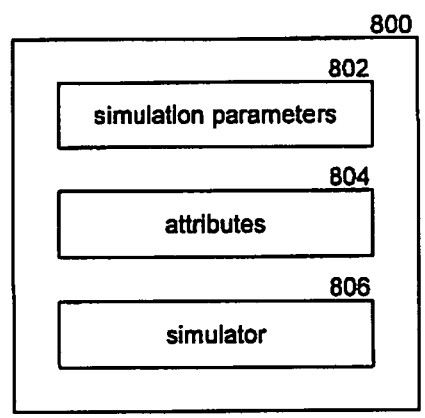
FIG. 8 is a block diagram illustrating components of the technology in various embodiments.

FIG. 8 is a block diagram illustrating components 800 of the technology in various embodiments. The components 800 can include simulation parameters 802, attributes 804, and a simulator 806. As explained above, the simulation parameters 802 may be employed to predict behavior of physical entities, e.g., in response to various stimuli. The attributes 804 may indicate statistics or other information about the physical entities participating in the physical context. The simulator 806 can be a simulator that employs the simulation parameters 802 and the attributes 804 to cause simulated entities to behave during simulation in accordance with how they may behave in the physical context.

Figure 9:
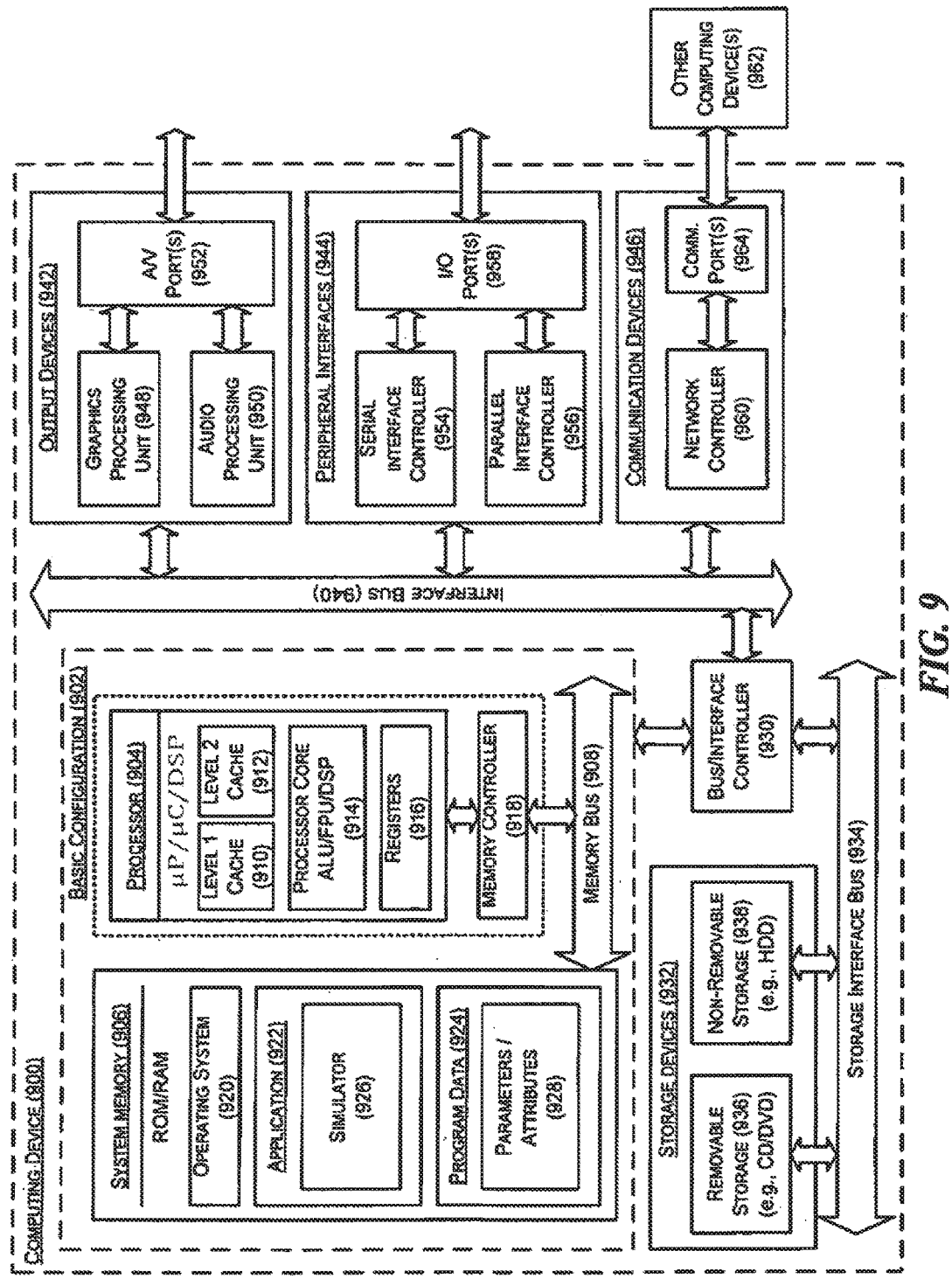
FIG. 9 is a block diagram of an illustrative embodiment of a computing device that is arranged in accordance with at least some embodiments of the present disclosure.

FIG. 9 is a block diagram illustrating an example computing device 900 that is arranged in accordance with at least some embodiments of the present disclosure. In a very basic configuration 902, computing device 900 typically includes one or more processors 904 and a system memory 906. A memory bus 908 may be used for communicating between processor 904 and system memory 906.

Depending on the desired configuration, processor 904 may be of any type including but not limited to a microprocessor (μP), a microcontroller (μC), a digital signal processor (DSP), or any combination thereof. Processor 904 may include one or more levels of caching, such as a level one cache 910 and a level two cache 912, a processor core 914, and registers 916. An example processor core 914 may include an arithmetic logic unit (ALU), a floating point unit (FPU), a digital signal processing core (DSP core), or any combination thereof. An example memory controller 918 may also be used with processor 904, or in some implementations memory controller 918 may be an internal part of processor 904.

Depending on the desired configuration, system memory 906 may be of any type including but not limited to volatile memory (such as RAM), non-volatile memory (such as ROM, flash memory, etc.) or any combination thereof. System memory 906 may include an operating system 920, one or more applications 922, and program data 924. Application 922 may include a simulator component 926 that is arranged to enable simulation of physical entities in a virtual context. Program data 924 may include parameters and/or attributes 928, as is described herein. In some embodiments; application 922 may be arranged to operate with program data 924 on operating system 920 such that rotation of displayed information is enabled or disabled, e.g., depending on an orientation of the display. This described basic configuration 902 is illustrated in FIG. 9 by those components within the inner dashed line.

Computing device 900 may have additional features or functionality, and additional interfaces to facilitate communications between basic configuration 902 and any required devices and interfaces. For example, a bus/interface controller 930 may be used to facilitate communications between basic configuration 902 and one or more data storage devices 932 via a storage interface bus 934. Data storage devices 932 may be removable storage devices 936, non-removable storage devices 938, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 906, removable storage devices 936 and non-removable storage devices 938 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of computing device 900.

Computing device 900 may also include an interface bus 940 for facilitating communication from various interface devices (e.g., output devices 942, peripheral interfaces 944, and communication devices 946) to basic configuration 902 via bus/interface controller 930. Example output devices 942 include a graphics processing unit 948 and an audio processing unit 950, which may be configured to communicate to various external devices such as a display or speakers via one or more A/V ports 952. Example peripheral interfaces 944 include a serial interface controller 954 or a parallel interface controller 956, which may be configured to communicate with external devices such as input devices (e.g., keyboard, mouse, pen, voice input device, touch input device, etc.) or other peripheral devices (e.g., printer, scanner, etc.) via one or more I/O ports 958. An example communication device 946 includes a network controller 960, which may be arranged to facilitate communications with one or more other computing devices 962 over a network communication link via one or more communication ports 964.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

Figure 10:
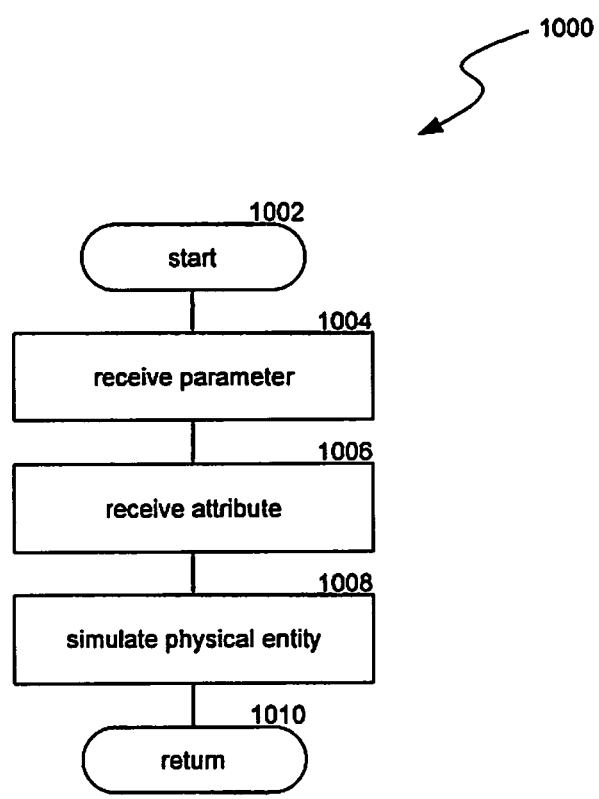
FIG. 10 is a flow diagram illustrating a method the technology may invoke in various embodiments.

FIG. 10 is a flow diagram illustrating a method the technology may invoke in various embodiments. In various embodiments, the technology invokes a method 1000, comprising: receiving a parameter 1004 corresponding to simulation of a physical entity in a virtual context; receiving an attribute 1006 corresponding to the physical entity in a physical context, wherein the attribute identifies an actual occurrence in the physical context; and simulating the physical entity 1008 in the virtual context using the attribute as a stimulus. The method can include observing the attribute at a sporting event, wherein the physical entity is a sports player and the physical context is the sporting event. The attribute can be a location of a sports apparatus and/or can relate to the sports player. The attribute can be a location of the sports player in the live or previously recorded sporting event, and/or a statistic relating to the sports player. The virtual context can be an electronic game and the sporting event can include multiple sports players from opposing teams. The sporting event can be a live or previously recorded sporting event that is broadcast. The virtual context can be an electronic game and the simulating can be started with each sports player from the opposing teams having similar positions and statistics as those of corresponding sports players in the broadcast sporting event. A user can control one or more physical entities in the virtual context. The simulating can include simulating the sports players in the virtual context that the user does not control.

In various embodiments, the technology invokes a method comprising: receiving a parameter corresponding to simulation of a physical entity in a virtual context; receiving an attribute corresponding to the physical entity in a first physical context, wherein the attribute identifies an actual occurrence in the first physical context; and simulating the physical entity in the virtual context using the attribute as a stimulus. The parameter can be based on statistical observation of the physical entity in one or more physical contexts. The one or more physical contexts may have occurred previously to the first physical context. The physical entity can be a car driver and the physical context can be a car driving route. The parameter may identify a driving style of the car driver.

Figure 11:
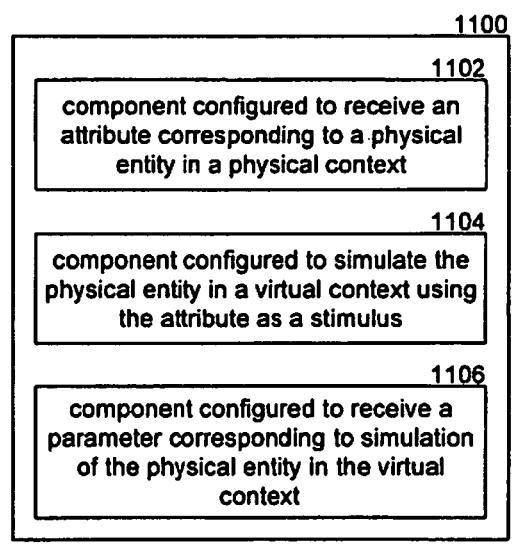
FIG. 11 is a block diagram illustrating components associated with the system in various embodiments.

FIG. 11 is a block diagram illustrating components associated with the system in various embodiments. In various embodiments, the technology includes a system 1100, comprising: a component 1102 configured to receive an attribute corresponding to a physical entity in a physical context, wherein the attribute identifies an actual occurrence in the physical context; and a component 1104 configured to simulate the physical entity in a virtual context using the attribute as a stimulus. The attribute may be received in a broadcast signal that also broadcasts the physical context. The virtual context may be simulated by a computing device. The system may include game consoles, mobile computing devices, etc. The system may include a component 1106 configured to receive a parameter corresponding to simulation of the physical entity in the virtual context. The attribute may be observed based on a device embedded in a sports apparatus employed during the physical context. The sports apparatus may be a ball, a car, etc. The device may be a component of a radio frequency identification system. The attribute may be observed by a scene recognition technology. The scene recognition technology may comprise image recognition. The image recognition may comprise recognition of a sports player, a sports apparatus, and/or a physical location relative to the physical context. The physical location may be a position on a sports field.

In various embodiments, the technology invokes a method, comprising: receiving a parameter corresponding to simulation of a sports player in a virtual context; receiving an attribute corresponding to the sports player in a sporting event, wherein the attribute identifies a statistic of the sporting event; and simulating the sports player in the virtual context using the attribute as a stimulus. The method can further comprise employing the received attribute in the virtual context. The attribute may be a location of a sports apparatus.

From the foregoing, it will be appreciated that various embodiments of the present disclosure have been described herein for purposes of illustration, and that various modifications may be made without departing from the scope of the present disclosure. Accordingly, the various embodiments disclosed herein are not intended to be limiting, with the true scope being indicated by the following claims.

I claim:

1. A method performed by a computer system that has a processor and a memory to simulate a physical sports event, the method comprising:

receiving, from the physical sports event, one or more attributes that correspond to participation of a physical sports player in the physical sports event,
   wherein the one or more attributes include at least one attribute related to an actual present occurrence during the physical sports event, and
   wherein the at least one attribute includes location information that corresponds to a present location of the physical sports player during the participation in the physical sports event;
receiving one or more parameters that include information usable to predict future behavior of the physical sports player, wherein the one or more parameters are received in response to the at least one attribute being presented, as a stimulus for the future behavior, on a display;
starting a simulation of the physical sports event in a virtual context, in which physical entities in the physical sports event are simulated from a situation similar to that of the physical sports event at a time of the start of the simulation,
   wherein the physical entities include the physical sports player, and
   wherein a simulation of the physical sports player is based, at least in part, on the one or more parameters, the location information that corresponds to the present location of the physical sports player, and the predicted future behavior of the physical sports player that participates in the physical sports event;
enabling participatory user control of the simulated physical sports player in the simulation of the physical sports event;
enabling control of an action by at least one of the simulated physical entities, other than the simulated physical sports player, in the simulation of the physical sports event; and
controlling the simulation of the physical sports event with the simulated physical sports player under the participatory user control in accordance with the predicted future behavior, and with the controlled action by the at least one of the simulated physical entities other than the simulated physical sports player.

2. The method of claim 1, wherein the location information includes a location of the physical sports player in a live physical sports event or a previously recorded physical sports event.

3. The method of claim 1, wherein the one or more attributes include a statistic related to the physical sports player.

4. The method of claim 1, wherein:
the virtual context includes an electronic game, and
the physical entities include one or more physical sports players from opposition teams in the physical sports event.

5. The method of claim 4, wherein the physical sports event includes a live physical sports event or a previously recorded physical sports event that is broadcast.

6. A computer-readable hardware device having stored thereon instructions that, in response to execution by a computer device, cause the computer device to perform or control performance of operations that comprise:
obtain, from a physical sports event, one or more attributes that correspond to participation of a physical sports player in the physical sports event,
   wherein the one or more attributes include at least one attribute related to an actual present occurrence during the physical sports event, and
   wherein the at least one attribute includes location information that corresponds to a present location of the physical sports player during the participation in the physical sports event;
obtain one or more parameters that include information usable to predict future behavior of the physical sports player, wherein the one or more parameters are obtained in response to the at least one attribute being presented, as a stimulus for the future behavior, on a display;
start a simulation of the physical sports event in a virtual context, in which physical entities in the physical sports event are simulated from a situation similar to that of the physical sports event at a time of the start of the simulation,
   wherein the physical entities include the physical sports player, and
   wherein the physical sports player is simulated based, at least in part, on the one or more parameters, the location information that corresponds to the present location of the physical sports player, and the predicted future behavior of the physical sports player that participates in the physical sports event;
enable participatory user control of the simulated physical sports player in the simulation of the physical sports event;
enable control of an action by at least one of the simulated physical entities, other than the simulated physical sports player, in the simulation of the physical sports event; and
control the simulation of the physical sports event with the simulated physical sports player under the participatory user control in accordance with the predicted future behavior, and with the controlled action by the at least one of the simulated physical entities other than the simulated physical sports player.

7. The computer-readable hardware device of claim 6, wherein the one or more parameters include at least one parameter based on statistical observation of the physical sports player in one or more physical sports events.

8. The computer-readable hardware device of claim 6, wherein the one or more parameters include at least one parameter based on statistical observation of the physical sports player in one or more physical sports events that occurred previously to the physical sports event.

9. The computer-readable hardware device of claim 8, wherein the physical sports player includes a car driver and the physical sports event includes a car driving route.

10. The computer-readable hardware device of claim 9, wherein the one or more parameters include at least one parameter that identifies a driving style of the car driver.

11. A system, comprising:
a display;
one or more communication ports configured to receive one or more attributes that correspond to participation of a physical sports player in a physical sports event,
   wherein the one or more attributes include at least one attribute related to an actual present location of the physical sports player during the physical sports event;
one or more processors coupled to the display and to the one or more communication ports, and configured to start a simulation of the physical sports event in a virtual context, in which physical entities in the physical sports event are simulated from a situation similar to that of the physical sports event at a time of the start of the simulation, wherein the physical entities include the physical sports player, wherein the physical sports player is simulated by use of the one or more attributes as a stimulus for future behavior of the simulated physical sports player in the simulation of the physical sports event, and wherein the simulation of the physical sports player is based on a prediction of the future behavior of the physical sports player, wherein the prediction of the future behavior is made in response to the one or more attributes being presented, as the stimulus, on the display;

one or more user input devices coupled to the one or more processors and configured to enable participatory user control of the simulated physical sports player in the simulation of the physical sports event;

a first component coupled to the one or more processors and configured to enable control of an action by at least one of the simulated physical entities, other than the simulated physical sports player, in the simulation of the physical sports event; and a second component coupled to the one or more processors and the one or more user input devices, wherein the second component is configured to control the simulation of the physical sports event with the simulated physical sports player under the participatory user control in accordance with the predicted future behavior, and with the controlled action by the at least one of the simulated physical entities other than the simulated physical sports player.

12. The system of claim 11, wherein the one or more attributes include at least one attribute received in a broadcast signal that broadcasts the physical sports event.

13. The system of claim 11, wherein the virtual context is simulated by a game console computer device.

14. The system of claim 11, wherein the virtual context is simulated by a mobile computer device.

15. The system of claim 11, wherein the one or more communication ports are further configured to receive one or more parameters that include information useful in the prediction of the future behavior of the physical sports player.

16. The system of claim 11, wherein the one or more attributes include at least one attribute observed based on a device embedded in a sports apparatus that is employed in the physical sports event.

17. The system of claim 16, wherein the sports apparatus includes a ball.

18. The system of claim 16, wherein the device is a part of a radio frequency identification system.

19. The system of claim 11, wherein the one or more attributes include at least one attribute observed by a scene recognition technology.

20. The system of claim 19, wherein the scene recognition technology comprises image recognition.

21. The system of claim 20, wherein the image recognition comprises recognition of the physical sports player.

22. The system of claim 20, wherein the image recognition comprises recognition of a sports apparatus.

23. The system of claim 20, wherein the image recognition comprises recognition of the actual present location relative to the physical sports event.

24. The system of claim 23, wherein the actual present location includes a position on a sports field.

25. A method performed by a computer system to simulate a physical event, the method comprising:

receiving a first input of one or more attributes related to a physical context of the physical event, wherein the receiving the first input of the one or more attributes includes receiving at least one first attribute related to a present location of a physical entity in the physical event;

receiving a second input of one or more parameters related to a prediction of future behavior of the physical entity, wherein the receiving the second input of the one or more parameters includes receiving at least one parameter related to information usable to predict the future behavior of the physical entity in the physical event, wherein the at least one parameter is received in response to the at least one first attribute being presented, as a stimulus for the future behavior, on a display;

receiving an indication to activate a computer device to start a simulation of the physical event in a virtual context in which the physical entity is simulated, wherein the start of the simulation includes positioning the simulated physical entity in the simulation at a location that corresponds to the present location of the physical entity in the physical event in accordance with the at least one parameter and in accordance with the at least one first attribute; and in response to receipt of the indication, starting the simulation with user control of the simulated physical entity to interact with the simulation from the location at which the simulated physical entity is positioned.

26. The method of claim 25, further comprising facilitating a visual display of the simulation, wherein the visual display of the simulated physical entity starts at the present location of the physical entity in a television broadcast of the physical event, wherein the simulation includes a video game.

27. The method of claim 26, further comprising determining the present location of the physical entity by use of image recognition applied to the television broadcast.

28. The method of claim 25, wherein:

the receiving the one or more attributes includes receiving at least one second attribute related to a present physical context other than the present location of the physical entity in the physical event, and the simulation of the physical entity is based, at least in part, on the at least one second attribute.

29. The method of claim 25, further comprising receiving at least one second attribute related to an actual present occurrence in a physical context other than the physical event, wherein the future behavior of the physical entity is stimulated by the at least one second attribute.

* * * * *